United States Patent [19]

Hurwitt

[11] Patent Number: 5,620,578
[45] Date of Patent: Apr. 15, 1997

[54] SPUTTERING APPARATUS HAVING AN ON BOARD SERVICE MODULE

[75] Inventor: Steven Hurwitt, Park Ridge, N.J.

[73] Assignees: Sony Corporation, Tokyo, Japan; Materials Research Corp., Orangeburg, N.Y.

[21] Appl. No.: 583,200

[22] Filed: Jan. 4, 1996

Related U.S. Application Data

[63] Continuation of Ser. No. 352,000, Dec. 8, 1994.

[51] Int. Cl.$^6$ ............................ C23C 14/56; C23C 16/00
[52] U.S. Cl. ............................ 204/298.25; 204/298.11; 118/719; 118/720; 118/721
[58] Field of Search ..................... 204/298.11, 298.25, 204/298.26, 298.35; 118/719, 720, 721; 156/345

[56] References Cited

U.S. PATENT DOCUMENTS

| | | | |
|---|---|---|---|
| 3,314,395 | 4/1967 | Hemmer | 118/721 |
| 3,516,386 | 6/1970 | Landwehr et al. | 118/721 |
| 4,909,695 | 3/1990 | Hurwitt et al. | 414/217 |
| 5,065,698 | 11/1991 | Koike | 118/719 |
| 5,076,205 | 12/1991 | Vowles et al. | 156/345 |
| 5,244,554 | 9/1993 | Yamagata et al. | 204/192.2 |
| 5,364,219 | 11/1994 | Takahashi et al. | 204/298.25 |
| 5,429,729 | 7/1995 | Kamei et al. | 204/192.12 |

FOREIGN PATENT DOCUMENTS

| | | |
|---|---|---|
| 0511733A1 | 4/1992 | European Pat. Off. . |
| 4037580A1 | 11/1990 | Germany . |

*Primary Examiner*—R. Bruce Breneman
*Assistant Examiner*—Rodney G. McDonald
*Attorney, Agent, or Firm*—Pasquale Musacchio; Jerry A. Miller

[57] ABSTRACT

A system for sputtering a substrate is disclosed. The system includes a central housing having at least one process module for forming the layer, wherein the process module is in fluid communication with the central housing and includes a first device used in conjunction with forming the layer on the substrate. In addition, the system includes at least one service module in fluid communication with the central housing, wherein the service module includes at least one replacement device suitable for replacing the first device. The central housing includes a robotic element for transporting the first device from the process module to the service module and for transporting the replacement device from the service module to the process module in order to replace the first device. In addition, the service module includes a dedicated pump for evacuating the service module to a high vacuum in order to reduce surface outgassing of the replacement device to a desired level before use.

7 Claims, 8 Drawing Sheets

SPUTTERING APPARATUS HAVING AN ON BOARD SERVICE MODULE

This is a continuation of application Ser. No. 08/352,000 filed on Dec. 8, 1994 which is hereby incorporated by reference.

The disclosure of U.S. Pat. No. 4,909,695 is hereby incorporated herein by reference.

FIELD OF THE INVENTION

The present invention relates to the sputtering of thin films onto a substrate and more particularly, to a sputtering apparatus having an on board service module for storing fixtures under a high vacuum.

BACKGROUND OF THE INVENTION

A sputtering process is typically utilized in the manufacture of integrated circuits (ICs). This process includes the formation of a thin layer of metal on a substrate such as a silicon or a gallium arsenide wafer. Frequently, a sputtering system is utilized which enables a plurality of substrates to be sputtered simultaneously. Such systems include a plurality of process modules each of which provide a high vacuum environment for performing the sputtering process. In addition, each of the process modules include a source target from which material is removed and used for forming the metal layer on the substrate. Consequently, material from the target is depleted through use, which necessitates replacement of the target and defines a life cycle for the target. By way of example, a typical target includes sufficient material to enable the deposition of a 1 micron thick layer on approximately 5,000 to 10,000 substrates before the target becomes depleted, thus defining the end of the target life cycle at which time sputtering is stopped and the depleted target is replaced. Generally, replacement entails venting the process module to atmosphere, manually opening the process module to enable replacement of the target, closing and sealing the process module upon replacement of the target and evacuating the process module to a high vacuum.

Referring to FIG. 1, a conventional sputtering system 10 having a cluster tool configuration is shown as a partial cutaway view. The system 10 includes a central housing 12 having an internal central chamber 14 and a system pump (not shown) for evacuating the central chamber 14 to a high vacuum. The central chamber 14 includes a substrate entry load lock 16 for receiving a substrate 42 and an exit load lock 18 for removal of the substrate 42. The system 10 further includes a plurality of process modules wherein sputtering of substrates is performed. For purposes of illustration, first 20, second 22 and third 24 process modules are shown in FIG. 1. The first 20, second 22 and third 24 process modules are in fluid communication with the central chamber 14. In addition, the first 20, second 22 and third 24 process modules each include a module pump (not shown) for evacuating the process module to a high vacuum and a vent valve (not shown) for venting the process module to atmosphere. Further, the system 10 includes first 26 and second 28 ports which may be used for the addition of other modules.

First 30, second 32, third 34, fourth 36 and fifth 38 module valves are associated with the first 20, second 22 and third 24 process modules and the first 26 and second 28 ports, respectively. The first 30, second 32 and third 34 module valves may each be positioned in an open position which enables its associated process module 20, 22, 24, respectively, to be in fluid communication with the central chamber 14. Alternatively, the first 30, second 32 and third 34 module valves may each be positioned in a closed position which serves to isolate its associated process module 20, 22, 24, respectively, from the central chamber 14.

Furthermore, the system 10 includes a robotic arm 40 located within the central chamber 14. The robotic arm 40 serves to transport the substrate 42 between the entry 16 and exit 18 load locks and between the first 20, second 22 and third 24 process modules as desired.

Various types of devices, fixtures and associated parts (not shown) are utilized in a process module for supporting the substrate 42 and to ensure proper deposition of material on the substrate 42. These include fixtures which serve to support the substrate 42 as the substrate 42 is sputtered known as clamp ring or clamp finger assemblies. Other fixtures include deposition shields which are located adjacent to the substrate 42 and which serve to protect portions of the clamp ring or clamp finger assemblies. Further, fixtures for controlling the angular deposition of material on the substrate 42 known as collimator plates are also utilized. It is noted that many other types of devices, fixtures and tools for ensuring proper deposition of material on the substrate 42 may be used in a process module. Due to their structure and location, many portions of these fixtures are in close proximity to the substrate 42. As such, material from the target which is intended to be deposited on the substrate 42 is also undesirably collected on the fixtures, thus coating the fixtures with target material. This undesirably affects the operation of the fixtures and ultimately the sputtering process. In particular, it has been determined that operation of the fixtures is undesirably affected after the fixtures have been coated with only 2000–3000 microns of material. Consequently, it is desirable to replace each of the fixtures after they have been coated with approximately 2000 microns of material. As such, the life cycle for each of the fixtures is substantially shorter than the life cycle for the associated target. In particular, it has been found that the fixtures may be replaced approximately 5 times for each time that the target is replaced.

In order to access and replace fixtures located in the first process module 20, for example, the first module valve 30 is first closed, thus isolating the first process module 20 from the central chamber 14. The first process module 20 is then vented to atmosphere and manually opened to provide access to the fixtures. The fixtures are then replaced, at which time the first process module 20 is manually closed and sealed. The first module valve 30 may then be opened after evacuation of the first process module 20 to a high vacuum. However, the method used for replacement of fixtures in such a system 10 has disadvantages. A disadvantage is that a substantial amount of time is required, i.e. up to 8 hours or more, to complete the procedure and ultimately achieve high vacuum. As a result, the system 10 does not operate for a substantial amount of time, thus substantially decreasing productivity and increasing operating costs. In addition, the amount of time needed for achieving a high vacuum is substantially increased if new fixtures are used which have not previously been subjected to vacuum conditioning to reduce surface outgassing to a desired level. Further, exposure of the first process module 20 to atmosphere frequently requires a requalification of film properties before the system 10 may be certified as suitable for production. Additionally, since the fixtures may be replaced as many as 5 times for each time that the target is replaced, the amount of time that the system 10 does not operate is further increased, thus further reducing productivity and increasing operating costs.

Another type of sputtering system is described in U.S. Pat. No. 4,909,695, which issued to Hurwitt, et al. and is assigned to Materials Research Corporation, the assignee herein. This patent discloses a production sputtering system in which a coated wafer holding fixture may be replaced through a load lock normally used for substrate entry and exit. However, although this system enables the process module to remain under vacuum, this system does not provide for vacuum conditioning of the wafer holding fixture to reduce surface outgassing. In addition, the configuration of the system is such that only the wafer holding fixture may be replaced. Further, replacement of the wafer holding fixture is performed manually, thus substantially increasing the time needed for replacing the fixture which results in substantially reduced productivity and increased costs.

Therefore, it is an object of the present invention to provide a sputtering system having an on board service module which provides for vacuum conditioning of fixtures which are to be used in a process module before the fixtures are installed in the process module. It is a further object of the present invention to provide a sputtering system having an on board service module which enables the replacement of more than one type of fixture. It is a still further object of the present invention to provide a sputtering system having an on board service module which enables automated replacement of a coated fixture. Additionally, it is an object of the present invention to provide for a sufficient number of replacement fixtures and associated parts so that venting and opening of a process module is not necessary until a source target is replaced.

SUMMARY OF THE INVENTION

A system for forming a layer on a substrate having at least one process module for forming the layer, wherein the process module includes a first device used in conjunction with forming the layer on the substrate. The system further includes at least one service module affixed to the process module, wherein the service module includes at least one replacement device suitable for replacing the first device. Furthermore, the system includes a robotic element for transporting the first device from the process module to the service module and for transporting the replacement device from the service module to the process module for replacing the first device.

DETAILED DESCRIPTION OF THE DRAWINGS

Figure 1:
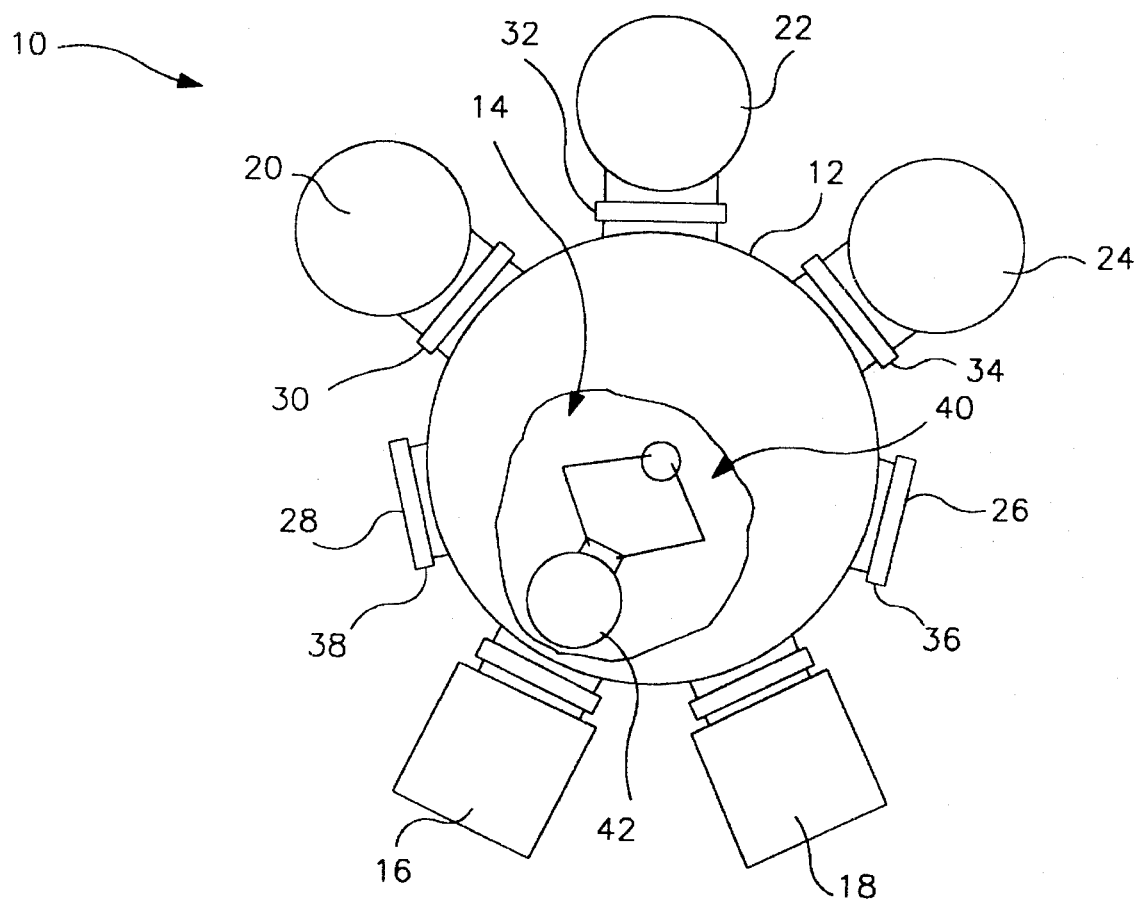
FIG. 1 is a top view of a prior art sputtering system.
Figure 2:
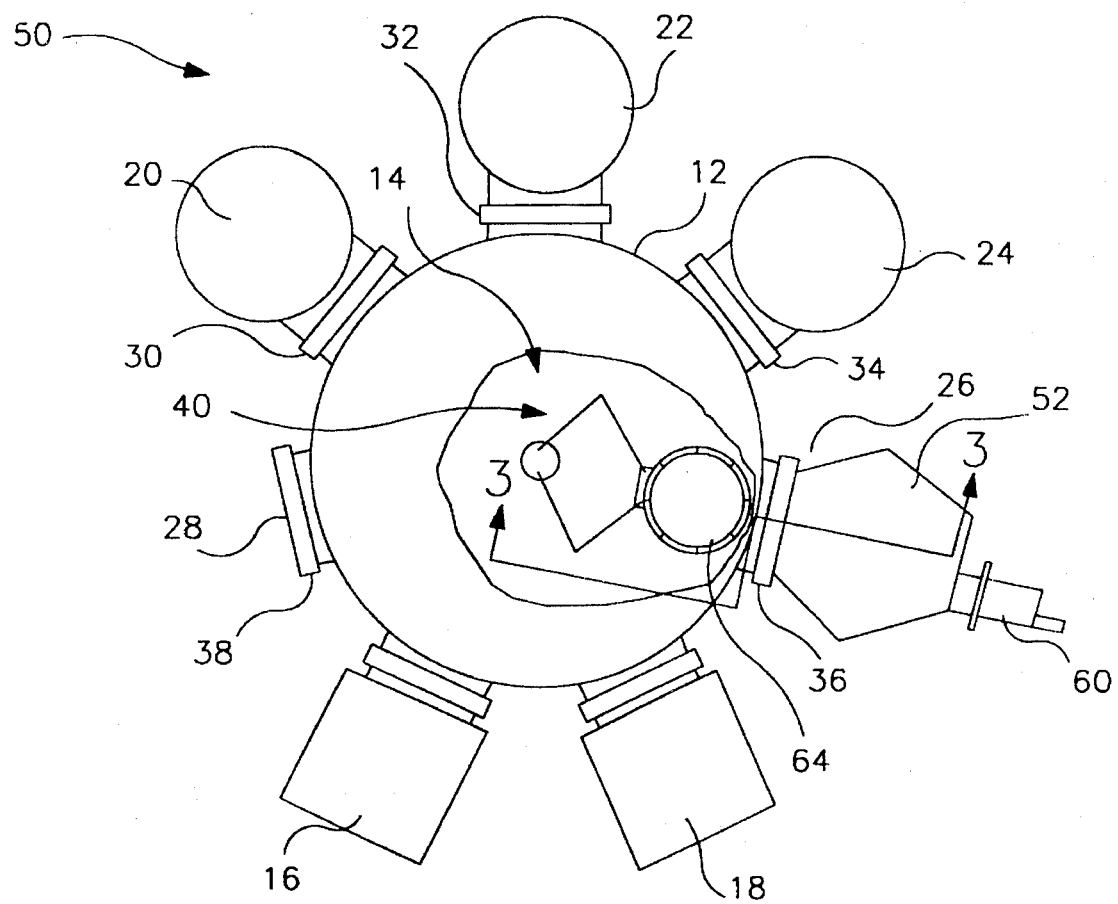
FIG. 2 is a top view of a system for sputtering a substrate having a service module in accordance with the present invention.
Figure 3:
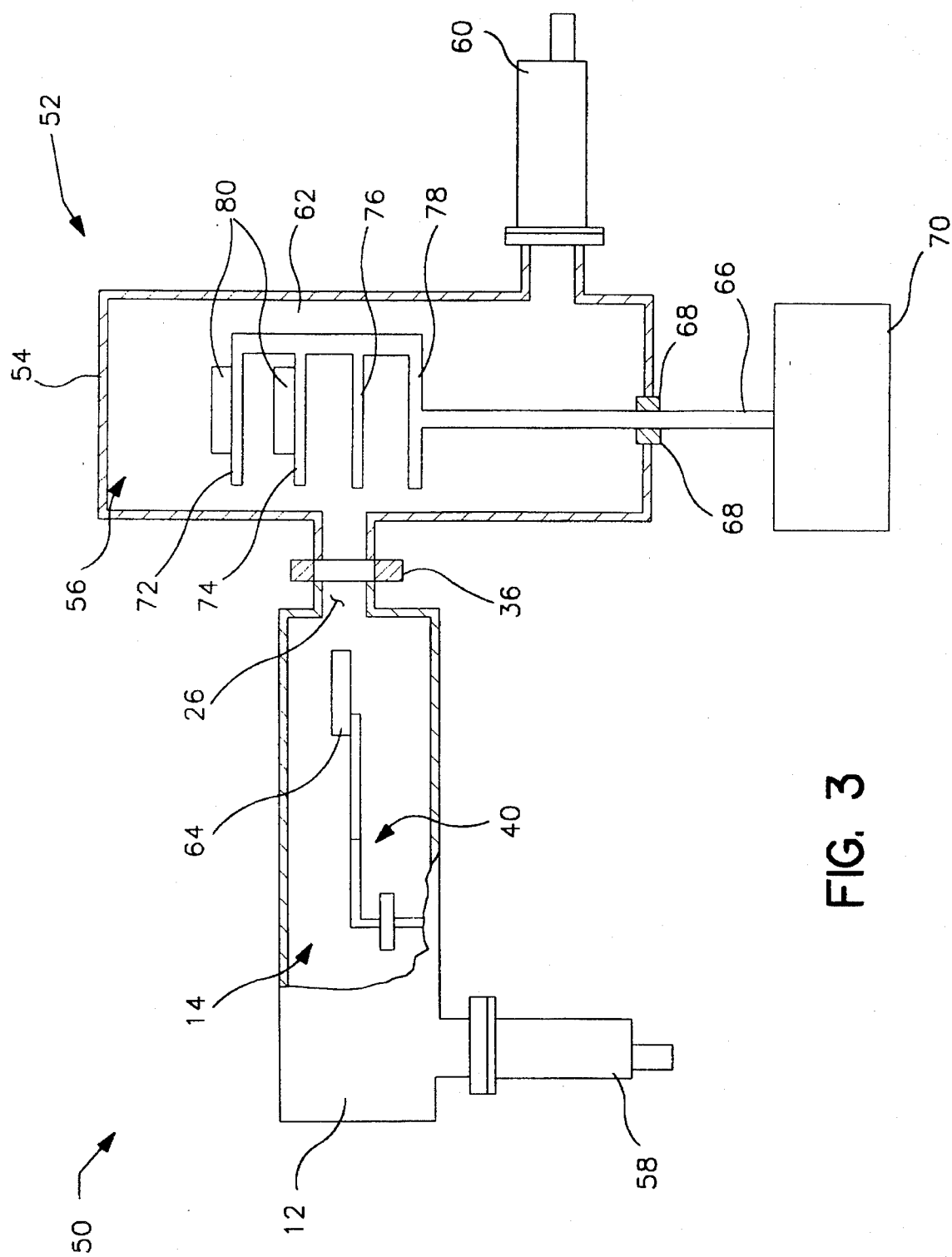
FIG. 3 is a partial cross sectional view of the present invention along section line 3—3 of FIG. 2 depicting a coated fixture which is to be placed on a shelf of the system.

The present invention will now be described by referring to FIGS. 2–8, wherein like elements are designated by like reference numerals. It is noted that elements from FIG. 1 will also be referenced. Referring to FIGS. 2–3, a sputtering system 50 having a service module 52 in accordance with the present invention is shown. FIG. 3 is a partial cross sectional view of the central housing 12, central chamber 14, robotic arm 40, first port 26, fourth module valve 36 and service module 52 along section line 3—3 of FIG. 2. The service module 52 is adapted to be connected to either the fourth 36 or fifth 38 module valves. In FIG. 3, the service module 52 is shown connected to the fourth module valve 36 depicted in the open position. It is noted that the following description is equally applicable to a configuration wherein the service module 52 is connected to the fifth module valve 38. In addition, the robotic arm 40 is aligned with the first 26 and second 28 ports. This enables the robotic arm 40 to extend horizontally through the first port 26 when the fourth module valve 36 is in the open position.

The service module 52 includes a module housing 54 having an internal module chamber 56 configured to enable evacuation of the module chamber 56 to a high vacuum. The module chamber 56 is in fluid communication with the central chamber 14 when the fourth module valve 36 is in the open position. Alternatively, the module chamber 56 is isolated from the central chamber 14 when the fourth module valve 36 is in the closed position. The central housing 12 further includes a system pump 58 which serves to evacuate the central chamber 14 and the module chamber 56 when the fourth module valve 36 is in the open position. Alternatively, the service module 52 includes a dedicated pump 60 which is affixed to the module housing 54 and is in fluid communication with module chamber 56. Upon placement of the fourth module valve 36 in the closed position, thus isolating the module chamber 56 from the central chamber 14, the dedicated pump 60 serves to evacuate the module chamber 56 to a high vacuum.

The module chamber 56 includes a rack 62 having a plurality of horizontal shelves which are stacked Vertically and are spaced from each other. For purposes of illustration only, first 72, second 74, third 76 and fourth 78 shelves are shown in FIG. 3. The first 72, second 74, third 76 and fourth 78 shelves are each suitable for holding and storing a replacement fixture used in either of the first 20, second 22 or third 24 process modules. Alternatively, the first 72, second 74, third 76 and fourth 78 shelves are each sized to hold more than one replacement fixture.

Various types of devices, fixtures and associated parts are utilized in a process module for supporting the substrate 42 and to ensure proper deposition of material on the substrate 42. These include fixtures which serve to support the substrate 42 as the substrate 42 is sputtered known as clamp ring or clamp finger assemblies. Other fixtures include deposition shields which are located adjacent to the substrate 42 and which serve to protect portions of the clamp ring or clamp finger assemblies. Further, fixtures for controlling the angular deposition of material on the substrate 42 known as collimator plates are also utilized. It is noted that many other types of devices, fixtures and tools for ensuring proper deposition of material on the substrate 42 may be used in a process module. Due to their structure and location, many portions of these fixtures are in close proximity to the substrate 42. As such, material from the target which is intended to be deposited on the substrate 42 is also undesirably collected on the fixtures, thus coating the fixtures with target material. This undesirably affects the operation of the fixtures and ultimately the sputtering process. In particular, it has been determined that operation of the fixtures is undesirably affected after the fixtures have been coated with only 2000–3000 microns of material. Consequently, it is desirable to replace each of the fixtures after they have been coated with approximately 2000 microns of material. In a preferred embodiment, the first 72, second 74, third 76 and fourth 78 shelves are adapted to enable handling and storage of such replacement fixtures and others.

In accordance with the present invention, a replacement fixture for replacing a corresponding fixture which has been coated with target material is placed on selected shelves on the rack 62. In FIG. 3, the first 72 and second 74 shelves each include a replacement fixture 80 corresponding to a coated fixture removed by the robotic arm 40 from a selected process module. In addition, the third 76 and fourth 78 shelves are left empty to enable placement thereon of a coated fixture removed from the selected process module. In a preferred embodiment, the rack 62 includes a sufficient number of shelves and replacement fixtures, i.e. storage capacity, to enable a predetermined number of fixture replacements during each life cycle of each target. By way of example, this includes a sufficient number of shelves and replacement fixtures to enable replacement of coated fixtures approximately 5 times during each life cycle of each target. Furthermore, the rack 62 includes a vertical drive shaft 66 which extends downwardly in the module chamber 56 and out of the service module 52 through a sealing element 68 affixed in the module housing 54. The sealing element 68 serves to provide a sufficient seal for maintaining a high vacuum.

The service module 52 further includes an elevator drive mechanism 70 attached to the drive shaft 66 for vertically moving the drive shaft 66 and thus the first 72, second 74, third 76 and fourth 78 shelves. This enables individual alignment of each of the first 72, second 74, third 76 and fourth 78 shelves with the first port 26 and the robotic arm 40 as desired. As such, when the fourth module valve 36 is in the open position, the robotic arm 40 is able to extend horizontally through the first port 26 and into and out of the module chamber 56 as desired to access a desired shelf aligned with the first port 26. Alternatively, it is noted that service module 52 may also be connected to the fifth module valve 38, thus enabling the individual alignment of each of the first 72, second 74, third 76 and fourth 78 shelves with the second port 28 and the robotic arm 40. Therefore, when the fifth module valve 38 is in the open position, the robotic arm 40 is able to extend horizontally through the second port 28 and into and out of the module chamber 56 as desired to access a desired shelf aligned with the second port 28. Further, it is noted that an alternate robotic arm (not shown) may be used in place of or in addition to the robotic arm 40 to transport fixtures into and out of the service module 52.

Figure 4:
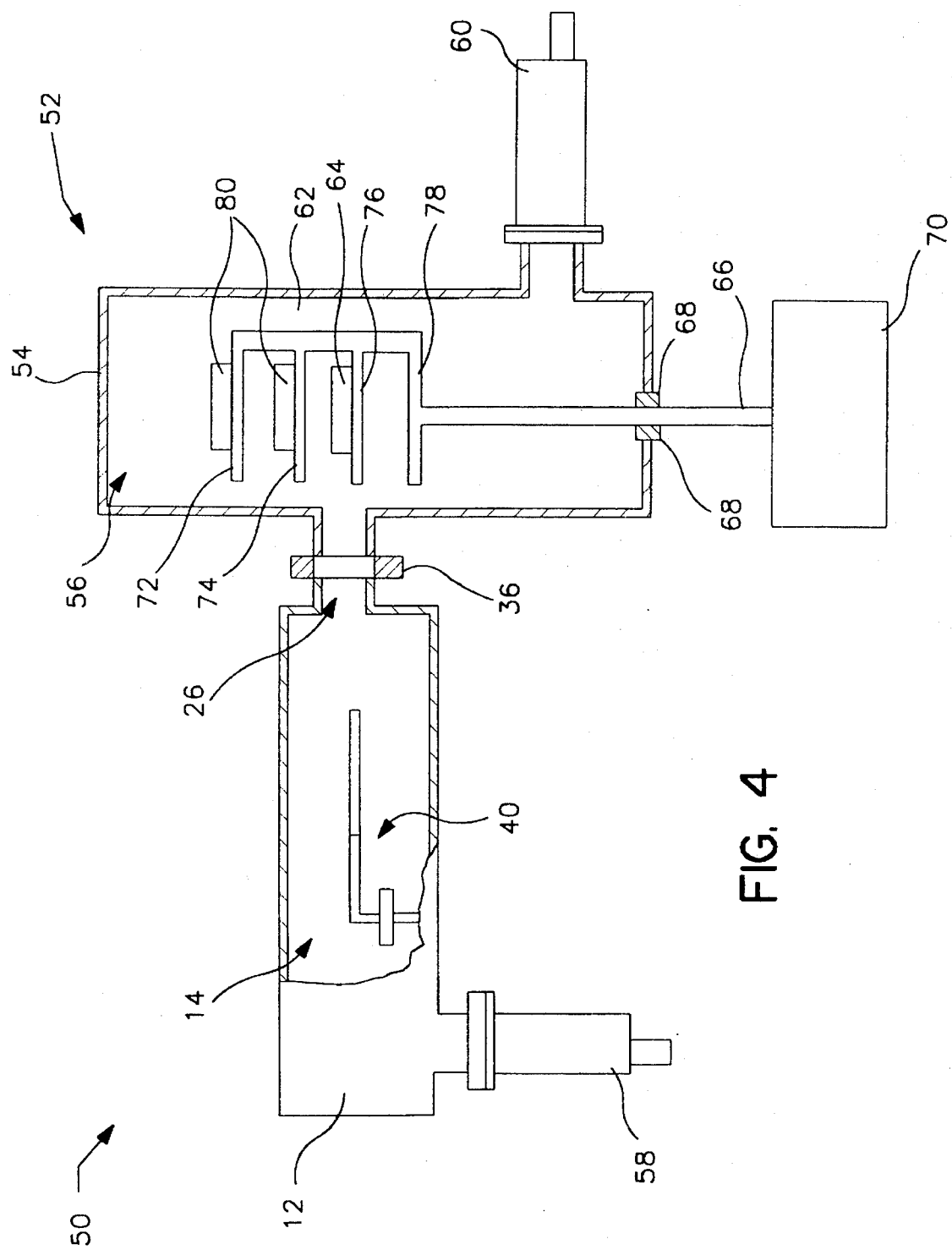
FIG. 4 is a partial cross sectional view of the present invention along section line 3—3 of FIG. 2 which shows the coated fixture placed on a shelf of the system.
Figure 5:
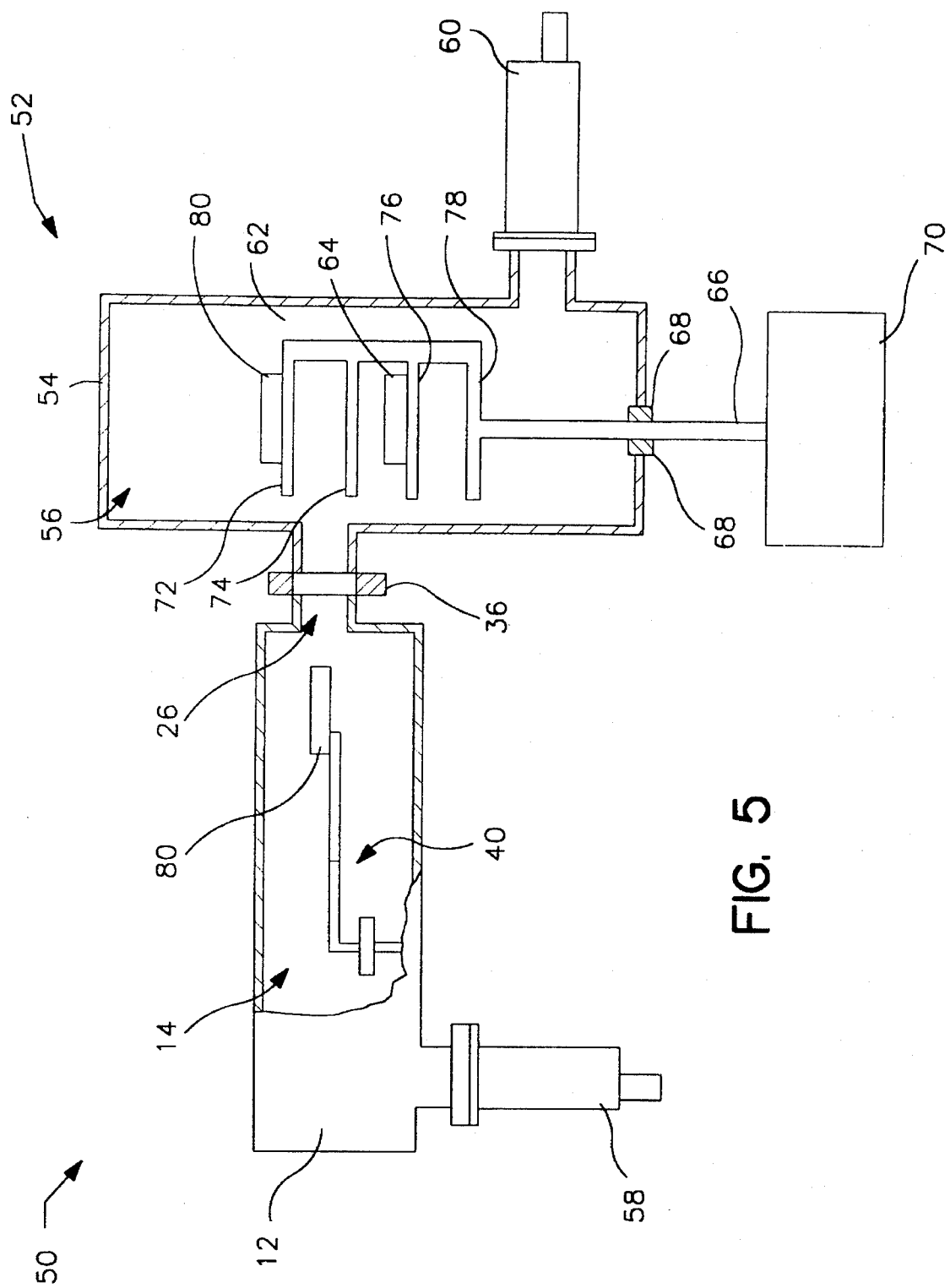
FIG. 5 is a partial cross sectional view of the present invention along section line 3—3 of FIG. 2 which a replacement fixture removed from a shelf of the system.

Operation of the service module 52 will now be described with reference to the first process module 20 and the second 74 and third 76 shelves and FIGS. 3–5, although it is noted that the following description is equally applicable to the second 22 and third 24 process modules and the first 72 and fourth 78 shelves. In use, the first 20, second 22 and third 24 process modules are kept under a high vacuum by associated module pumps (not shown). Further, the central 14 and module 56 chambers are kept under high vacuum by the system 58 and dedicated 60 pumps, respectively, and the fourth module valve 36 is in the open position. In order to place a coated fixture on the third shelf 76, the rack 62 is moved vertically by the drive mechanism 70 so as to align the third shelf 76 with the first port 26 and the robotic arm 40. The robotic arm 40 is then actuated to remove a coated fixture 64 from the first process module 20 and to transport the coated fixture 64 adjacent to the first port 26 (FIG. 3). The robotic arm 40 then extends through the first port 26 and into the module chamber 56 wherein the coated fixture 64 is placed on the third shelf 76 in the rack 62. The robotic arm 40 is then actuated to retract back into the central chamber 14 (FIG. 4). The rack 62 is then moved vertically in order to align the second shelf 74 with the first port 26 and the robotic arm 40. The robotic arm 40 is then actuated to move through the first port 26 and into the module chamber 56 to remove the replacement fixture 80 from the second shelf 74. The robotic arm 40 then transports the replacement fixture 80 out of the module chamber 56 and through the first port 26 (FIG. 5). The replacement fixture 80 is then transported by the robotic arm 40 to the first process module 20. This procedure is then repeated for each fixture to be replaced in the first process module 20. Consequently, the present invention provides for the automated replacement of coated fixtures, thus substantially increasing productivity and decreasing operating costs.

Upon use of all the replacement fixtures stored in the service module 52, it is desirable to install new replacement fixtures and to remove the coated fixtures from the service module 52. In accordance with the present invention, this is accomplished by placing the fourth module valve 36 in the closed position, thus isolating the module chamber 56 from the central chamber 14. The service module 52 is then vented and opened, thus enabling the removal of coated fixtures and the installation of new replacement fixtures on selected shelves on the rack 62. The service module 52 is then closed and sealed to enable evacuation of the module chamber 56 by the dedicated pump 60. The module chamber 56 is then evacuated for a sufficient period of time to precondition the replacement fixtures so as to reduce surface outgassing to a desired level. This enables the replacement fixtures to be readily available for use in the process module 20 as desired thus substantially increasing productivity and decreasing costs. Alternatively, the fourth module valve 36 may be positioned in the open position to enable evacuation of the module chamber 56 by the system pump 58. When the vacuum in the module chamber 56 is approximately equal to that of the central chamber 14, the fourth module valve 36 is then placed in the open position.

Figure 6A:
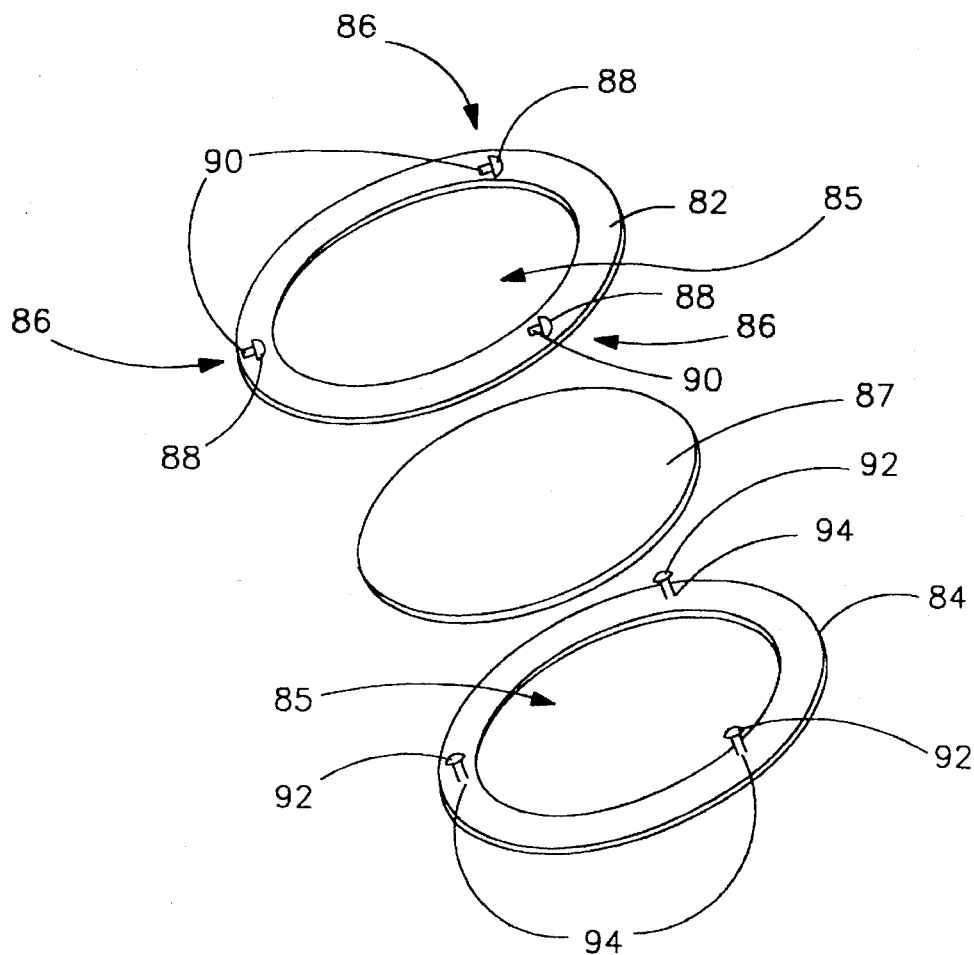
FIG. 6A is a perspective view of a fixture ring and a mounting base adapted to be assembled by a robotic arm.

The configuration of the robotic arm 40 may be such that its motion capabilities are limited to relatively simple motions. As such, it is desirable that the fixtures be adapted to the motion capabilities of the robotic arm 40 to enable the accurate placement and securing of the fixtures within the first 20, second 22 and third 24 process modules by the robotic arm 40. Referring to FIG. 6A, a fixture ring 82 and mounting base 84 for securing a substrate 87 are shown. The fixture ring 82 and mounting base 84 each include an opening 85 sized for providing suitable access to the substrate 87. The ring 82 includes a plurality of keyhole shaped apertures 86 each having a circular aperture section 88 and a slotted aperture section 90. The mounting base 84 includes a corresponding plurality of button elements 92 each of which are connected to the mounting base 84 by an upstanding post section 94 extending above the mounting base 84. Each of the button elements 92 are sized such that they may be inserted into a corresponding circular aperture section 88 and not into the slotted aperture section 90. Each post section 94 is sized such that it may inserted and moved laterally within a corresponding slotted aperture section 90.

Figure 6B:
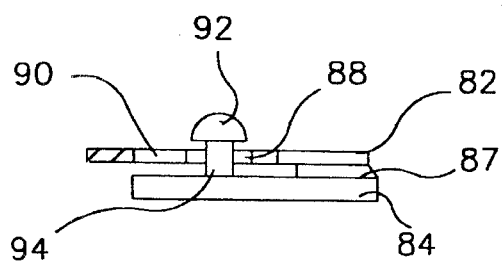
FIG. 6B is a partial cross sectional side view of the ring and mounting base.
Figure 6C:
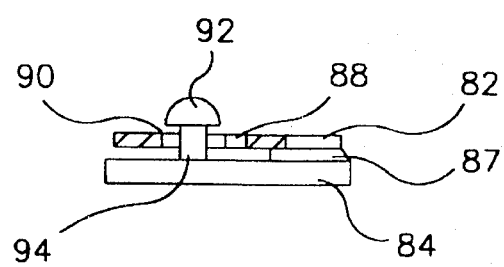
FIG. 6C is a partial cross sectional side view showing the ring secured to the mounting base.

In use, the substrate 87 is positioned between the ring 82 and the mounting base 84. In addition, the ring 82 is positioned above the mounting base 84 by the robotic arm 40 such that each of the button elements 92 are aligned with a corresponding circular aperture section 88. Referring to FIG. 6B, a partial cross sectional view of one of the button elements 92 and a section of the ring 82, substrate 87 and mounting base 84 is shown. In FIG. 6B, the substrate 87 is positioned between the ring 82 and mounting base 84. The ring 82 is lowered onto the substrate 87 such that each of the button elements 92 of the mounting ring 84 extend through a corresponding circular aperture section 88. Referring to FIG. 6C, the robotic arm 40 (FIG. 2) then horizontally moves the ring 82 such that each post section 94 is laterally inserted into a corresponding slotted aperture section 90. In this position, the ring 82 is inhibited from being removed from the mounting base 84 by each of the button elements 92, thus securing the substrate 87 between the ring 82 and the mounting base 84. In a preferred embodiment, the robotic arm 40 includes an end effector for transporting substrates and an adapter for gripping various fixtures.

Figure 7:
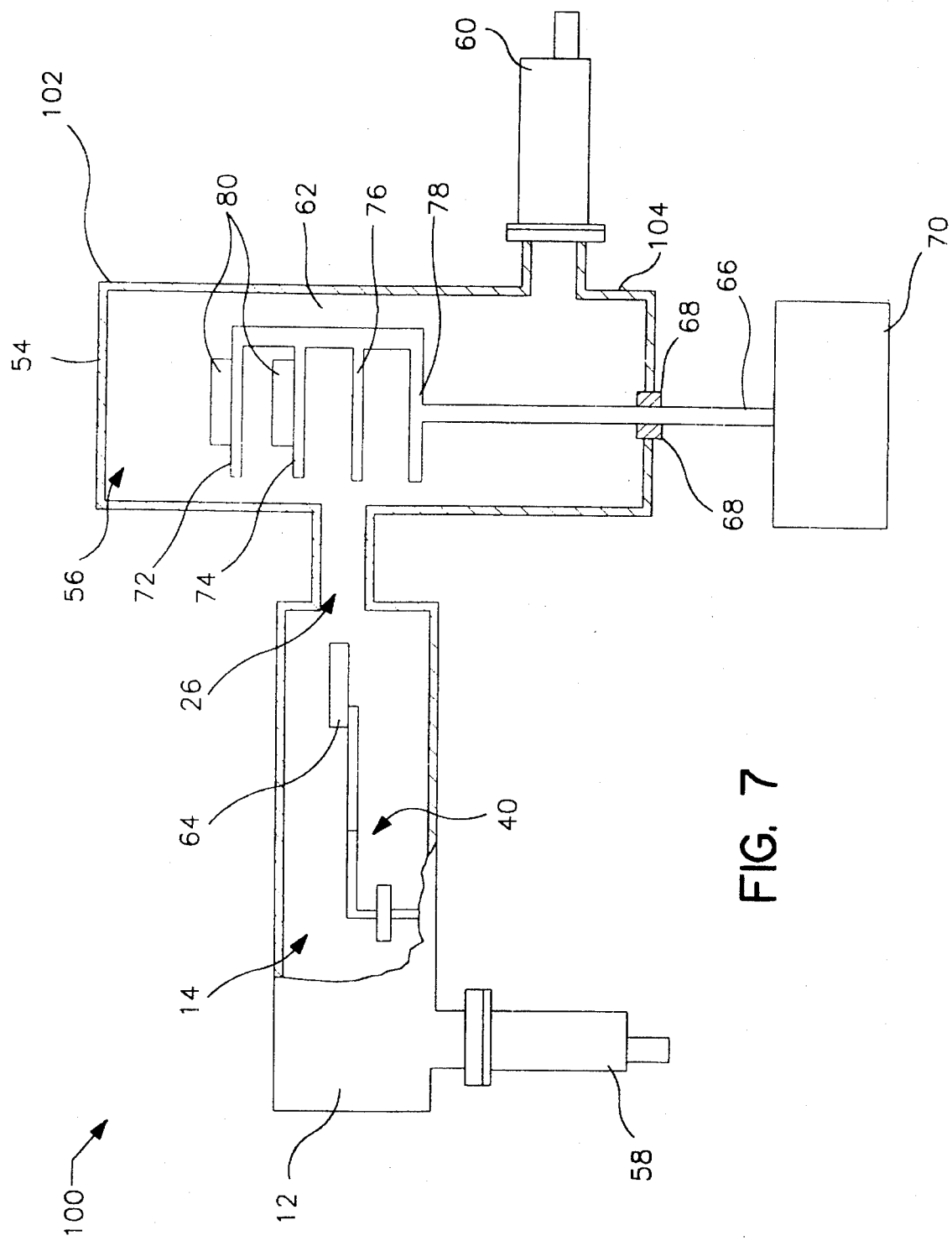
FIG. 7 is an alternate embodiment of the present invention showing a rack positioned within a central chamber.
Figure 8:
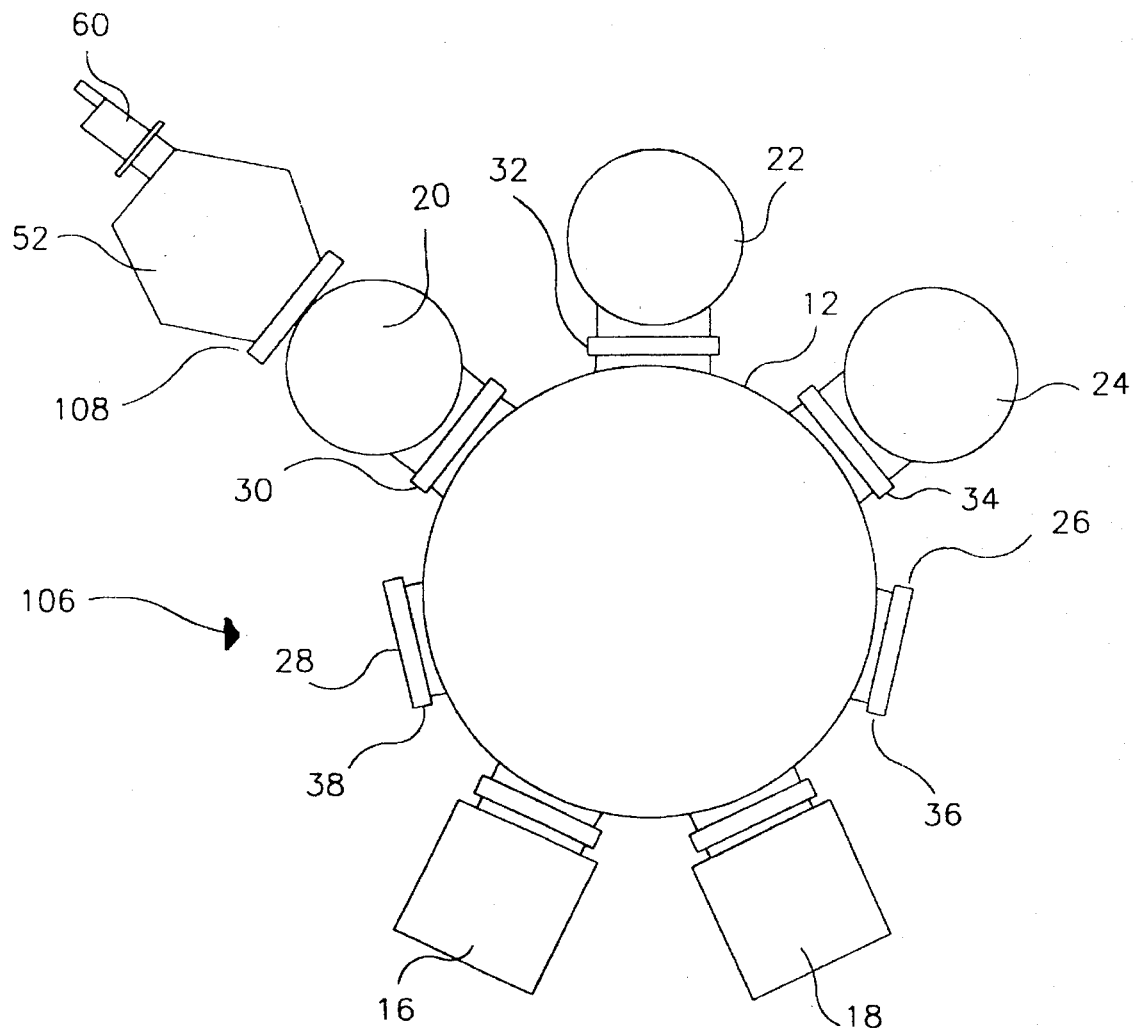
FIG. 8 is an alternate embodiment of the present invention wherein the service module is connected directly to a process module.

Referring to FIG. 7, an alternate embodiment of a sputtering system 100 in accordance with the present invention is shown. In this embodiment, the rack 62 is positioned within the central chamber 56. In order to accommodate the vertical travel of the rack 62, the central chamber 56 includes extended top 102 and bottom 104 portions within which the rack 62 travels to enable individual alignment of each of the first 72, second 74, third 76 and fourth 78 shelves with the robotic arm 40 as desired. Referring to FIG. 8, another embodiment for a sputtering system 106 in accordance with the present invention is shown. In this embodiment, the service module 52 is directly connected to either the first 20, second 22 or third 24 process modules by a sixth module valve 108. In FIG. 8, the service module 52 is shown directly connected to the first process module 20. In order to transport the fixtures in this embodiment, either the robotic arm 40 or a dedicated fixture handling mechanism may be employed. In yet another embodiment, the fixtures may be introduced directly through the entry load lock and into a process module. This enables unlimited fixture replacements without restrictions in regard to storage capacity.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A cluster tool system for forming a layer on a substrate, comprising:

a plurality of process modules for forming said layer, each of said process modules including a process chamber having a first device which is subjected to a deposition process in said chamber during formation of said layer on said substrate;

a single service module having at least one replacement device suitable for replacing said first device in any of Said process modules wherein said service module is maintained at a vacuum suitable for reducing out gassing of said replacement device to a desired level;

a central housing removably affixed to each of said process modules and to said service module;

a valve for isolating said service module from said central housing and each of said process modules;

evacuation means for providing evacuation of each of said process modules and said service module and said central housing to said vacuum, wherein when said valve is opened said evacuation of each of said process modules and said service module and said central housing is sufficient for maintaining said vacuum thereby minimizing time needed for evacuation; and a single robotic element located in said central housing, wherein said robotic element is adapted for transporting said first device from a selected process module selected from any of said process modules to said service module and for transporting said replacement device from said service module to said elected process module for replacing said first device under said vacuum.

2. The system according to claim 1 further including a rack in said service module having at least one shelf for storing said replacement device and for receiving said first device.

3. The system according to claim 2 further including a drive mechanism for moving said shelf to enable alignment with said robotic element.

4. The system according to claim 1, wherein said service module includes a pump for evacuating said service module to a vacuum level suitable for outgassing.

5. A cluster tool system for forming a layer on a substrate, comprising:

a plurality of process modules for forming said layer, each of said process modules including a process chamber having a first device which is subjected to a deposition process in said chamber during formation of said layer on said substrate;

a single service module having at least one replacement device suitable for replacing said first device wherein said service module is maintained at a vacuum suitable for reducing out, gassing of said replacement device to a desired level;

a central housing removably affixed in fluid communication to each of said process modules and said service module;

a valve for isolating said service module from said central housing and each of said process modules;

evacuation means for providing evacuation of each of said process modules and said service module and said central housing to said vacuum, wherein when said valve is opened said evacuation of said process modules and service module and said central housing is sufficient for maintaining said vacuum thereby minimizing time needed for evacuation;

a single robotic element located in said central housing, wherein said robotic element is adapted for transporting said first device from a selected process module to said service module and for transporting said replacement device from said service module to said selected process module for replacing said first device under said high vacuum;

a storage element for storing said replacement device in said service module; and a drive mechanism for moving said storage element within said service module to enable said robotic arm to place said first fixture in said storage element and to transport said replacement device from said storage element to said selected process module under said vacuum.

6. The service module according to claim 5, wherein storage element includes a rack having a plurality of shelves.

7. The service module according to claim 5, further including a dedicated pump for evacuating said service module.

* * * * *